United States Patent
Melosh et al.

(10) Patent No.: US 12,286,539 B2
(45) Date of Patent: Apr. 29, 2025

(54) METHOD FOR FORMING AND PATTERNING COLOR CENTERS

(71) Applicant: The Board of Trustees of the Leland Stanford Junior University, Stanford, CA (US)

(72) Inventors: Nicholas Alexander Melosh, Menlo Park, CA (US); Matthew A. Gebbie, Stanford, CA (US); Patrick McQuade, Stanford, CA (US); Andrew E. Gonzalez, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 1030 days.

(21) Appl. No.: 17/291,494

(22) PCT Filed: Oct. 30, 2019

(86) PCT No.: PCT/US2019/058880
§ 371 (c)(1),
(2) Date: May 5, 2021

(87) PCT Pub. No.: WO2020/096839
PCT Pub. Date: May 14, 2020

(65) Prior Publication Data
US 2022/0002555 A1    Jan. 6, 2022

Related U.S. Application Data

(60) Provisional application No. 62/756,360, filed on Nov. 6, 2018.

(51) Int. Cl.
C09C 1/44    (2006.01)
C09C 3/04    (2006.01)
(Continued)

(52) U.S. Cl.
CPC ............... *C09C 1/44* (2013.01); *C09C 3/04* (2013.01); *C09C 3/063* (2013.01); *C23C 16/12* (2013.01);
(Continued)

(58) Field of Classification Search
CPC .. C09C 1/44; C09C 3/04; C09C 3/063; C23C 16/12; C23C 16/4417; C23C 16/56
See application file for complete search history.

(56) References Cited

U.S. PATENT DOCUMENTS

| | | | |
|---|---|---|---|
| 2005/0019955 A1 | 1/2005 | Dahl et al. | |
| 2008/0219311 A1* | 9/2008 | Bratkovski | ........ G02B 6/12007 372/45.011 |
| 2017/0316487 A1 | 11/2017 | Mazed | |

FOREIGN PATENT DOCUMENTS

EP    0169622 A2 *    1/1986

OTHER PUBLICATIONS

Authorized Officer: Lee Young, International Search Report and Written Opinion issued in counterpart PCT application No. PCT/US2019/058880, Apr. 2, 2020, 8 pp.
(Continued)

*Primary Examiner* — James A Fiorito
(74) *Attorney, Agent, or Firm* — Kaplan Breyer Schwarz LLP (57) ABSTRACT

This disclosure enables the generation and patterning of color centers with nanometer-scale spatial control in a variety of materials in repeatable fashion and without the use of radiation. Embodiments in accordance with the present disclosure employ a layer of vacancy-injection material disposed on a host-material, where the vacancy-injection material forms a compound with host-material atoms at elevated temperatures. During compound formation, lattice vacancies are generated in the host material and diffuse within the substrate lattice to bond with impurity atoms, (Continued)

thereby forming color centers. High-resolution lithographic patterning of the vacancy-injection film and the short diffusion lengths of the lattice vacancies enables nanometer-level spatial control over the lateral positions of the color centers. Furthermore, the depth of the color centers in the substrate can be controlled by controlling the coating material, thickness, anneal time, and anneal temperature.

15 Claims, 8 Drawing Sheets

(51) Int. Cl.
| | |
|---|---|
| C09C 3/06 | (2006.01) |
| C23C 16/12 | (2006.01) |
| C23C 16/44 | (2006.01) |
| C23C 16/56 | (2006.01) |
| B82Y 10/00 | (2011.01) |
| B82Y 20/00 | (2011.01) |
| B82Y 40/00 | (2011.01) |
| H10F 39/00 | (2025.01) |

(52) U.S. Cl.
CPC .......... *C23C 16/4417* (2013.01); *C23C 16/56* (2013.01); *B82Y 10/00* (2013.01); *B82Y 20/00* (2013.01); *B82Y 40/00* (2013.01); *C01P 2004/64* (2013.01); *C01P 2006/60* (2013.01); *G02B 2207/101* (2013.01); *H10F 39/024* (2025.01); *H10F 39/806* (2025.01)

(56) References Cited

OTHER PUBLICATIONS

Shanying Cui, "Near-surface Nitrogen Vacancy Centers in Diamond", Doctoral Dissertation, Harvard University, Sep. 2014, 125 pp.

Christian Kurtsiefer et al., "Stable Solid-State Source of Single Photons", "Physical Review Letters", The American Physical Society, Jul. 10, 2000, vol. 85, No. 2, pp. 290-293.

Remmert Muller, "Implantatation and Optical Characterization of Color Centers in Silicon Carbide", Graduation Project, University of Amsterdam, Netherlands, Jan.-Dec. 2015, 59 pp.

\* cited by examiner

METHOD FOR FORMING AND PATTERNING COLOR CENTERS

CROSS REFERENCE TO RELATED APPLICATIONS

This application claims the benefit of U.S. Provisional Application Ser. No. 62/756,360, filed Nov. 6, 2018, entitled "Method for Forming and Patterning Color Centers", which is incorporated herein by reference. If there are any contradictions or inconsistencies in language between this application and one or more of the cases that have been incorporated by reference that might affect the interpretation of the claims in this case, the claims in this case should be interpreted to be consistent with the language in this case.

STATEMENT REGARDING FEDERALLY SPONSORED RESEARCH

This invention was made with Government support under Grant #: DE-AC02-76SF00515 awarded by the Department of Energy. The Government has certain rights in the invention.

TECHNICAL FIELD

The present disclosure relates to material processing in general, and, more particularly, to materials and processes for forming compositions comprising vacancy-based color centers suitable for use in quantum applications including quantum computing, quantum imaging and microscopy.

BACKGROUND

Color centers are optically active defects within the lattice structure of a material. In recent years, color centers have attracted a great deal of interest due to their potential as candidates for qubits, which are the fundamental physical computational unit for bio-imaging and quantum information processing systems. In addition, color centers are attractive for use in a wide range of applications, such as quantum sensors (e.g., temperature, magnetic, electric field, optical near field, etc.), quantum imagers, super-resolution microscopy systems, and more—with potential spatial resolution on the nanoscale or single-molecule level.

Diamond color centers can operate above liquid helium temperatures and can be efficiently coupled and manipulated using standard photonics approaches.

To date, production of color-centers has been typically performed by irradiating a host material with high-energy radiation to create lattice defects. Once the lattice defects are created, the material is subjected to a post-irradiation anneal to cause the defects to diffuse through the host material and interact with impurities to form color centers.

Unfortunately, the mass adoption of color-center-based systems has been slow due to two key challenges associated with conventional techniques for generating color centers. First, high-energy irradiation can cause significant damage to the host lattice, leading to poor material quality. Second, controlling the spatial distribution of color centers at the nanoscale is difficult, if not impossible using methods known in the prior art.

The need for a method for non-destructively generating and patterning color-centers with high resolution remains, as yet, unmet in the prior art. As a result, color-center generation remains a bottleneck for progress in systems and applications that rely on their use.

SUMMARY

An advance is made in the art according to aspects of the present disclosure, which is directed to the generation and patterning of color centers in a host material with nanoscale resolution without the need for high-energy irradiation.

In contrast to the prior art, methods in accordance with the present disclosure employ vacancy-inducing layers that are configured to draw atoms from host-material regions with which they are in contact during high-temperature annealing. Since no damaging radiation is required and such vacancy-inducing layers can be patterned with nanometer resolution, the teachings of the present disclosure enable high-quality color-center-containing materials that can contain sub-micron-scale patterns of color-center-containing regions.

An illustrative method in accordance with the present disclosure enables the creation of a spatially controlled pattern of color centers within a host material of diamond comprising an impurity of nitrogen. The method begins with the growth of a surface layer of nitrogen-doped diamond on a diamond substrate to form the host material. A patterned vacancy-inducing layer of aluminum is then formed on the surface layer, where the vacancy-inducing layer is patterned using high-resolution lithography such that it is in contact with the surface layer only in select regions. The vacancy inducing layer and substrate are then annealed to induce formation of aluminum carbide where the aluminum and nitrogen-doped diamond are in contact. During carbide formation, carbon atoms are thermodynamically driven to diffuse from the surface layer into the aluminum layer, thereby creating vacancies in the select regions. In each region, at least some of the vacancies interact with nitrogen atoms to form nitrogen-vacancy color centers. Because typical diffusion distances for the lattice vacancies are small, the fidelity between the pattern of the resultant color-center-containing regions and the pattern of the vacancy-inducing layer is high. As a result, the pattern of color-center-containing regions can have nanometer-scale features and/or spaces.

In some embodiments, the host material comprises a different material, such as silicon carbide, graphite, graphene, a metal oxide, a transition-metal dichalcogenide, among others.

In some embodiments, the impurity comprises a different material, such as silicon, germanium, lead, oxygen, and the like.

In some embodiments, the compound formed is a material other than a carbide, such as a nitride, oxide, silicide, and the like.

In some embodiments, the vacancy-inducing layer comprises a different vacancy-inducing material, such as titanium, tantalum, tungsten, and the like.

In some embodiments, the body comprising the host material is a nanoparticle. In some such embodiments, a plurality of host-material-containing nanoparticles are disposed on a suitable substrate.

An embodiment in accordance with the present disclosure is a method for forming color centers (110) in a body (102), the method including: providing the body such that it includes a first region (R1) that comprises a first material (106) and a first impurity (108); forming a first layer (302) having a first portion (P1) disposed on and in contact with the first region, wherein the first layer comprises a second material (306), and wherein the first and second materials collectively form a first compound (308) at a first temperature (T1); and heating the first layer and the body to the first temperature, wherein heating the first layer and the body to the first temperature enables: (1) diffusion of a first plurality of atoms (314) of the first material from the first region into the first portion to create a first plurality of vacancies (310) in the first region; and (2) interaction of the first plurality of vacancies and atoms (318) of the first impurity to form a first plurality of color centers (110) in the first region.

Another embodiment in accordance with the present disclosure is a method for forming color centers (110) in a body (102), the method including: providing the body such that it includes a first region (R1) that comprises diamond and nitrogen; forming a first layer (302) having a first portion (P1) disposed on and in contact with the first region, wherein the first layer comprises aluminum; and heating the first layer and the body to a first temperature (T1), wherein heating the first layer and the body to the first temperature enables: (1) formation of a carbide (308) on the first region; (2) diffusion of a first plurality of carbon atoms (314) from the first region into the first portion to create a plurality of vacancies (310) in the first region; and (3) interaction of the plurality of vacancies and nitrogen atoms (108) in the first region to form a first plurality of nitrogen-vacancy (NV) color centers (110) in the first region.

DETAILED DESCRIPTION

Figure 1A:
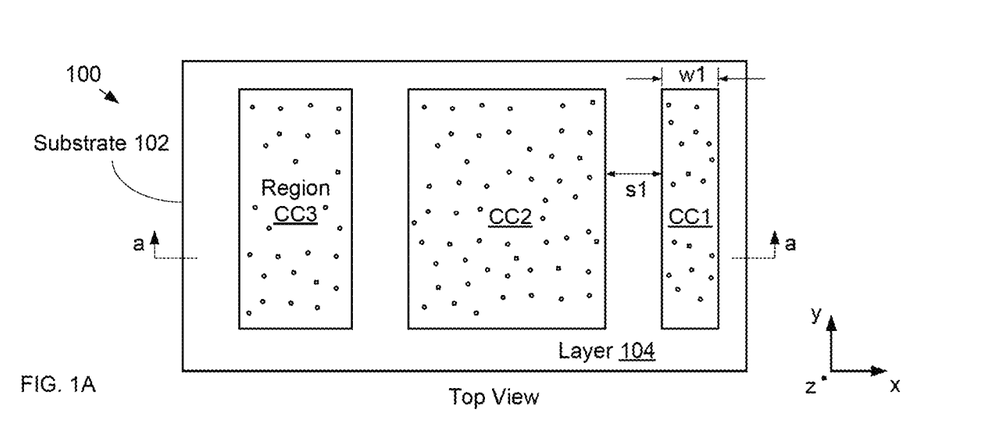
FIGS. 1A-B depict top and sectional views, respectively, of an illustrative embodiment of a composition comprising a pattern of color-center regions suitable for use in a quantum-technology application in accordance with the present disclosure.
Figure 1B:
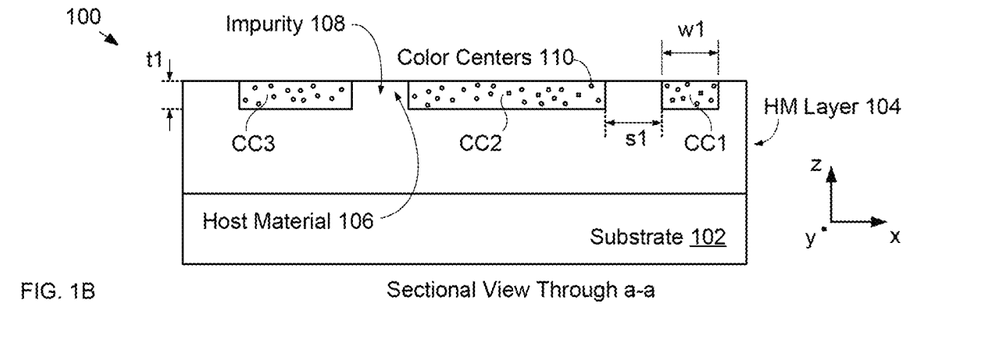

FIGS. 1A-B depict top and sectional views, respectively, of an illustrative embodiment of a composition comprising a pattern of color-center regions suitable for use in a quantum-technology application in accordance with the present disclosure. Composition 100 includes substrate 102, host-material (HM) layer 104, and color-center-containing regions CC1 through CC3.

Figure 2:
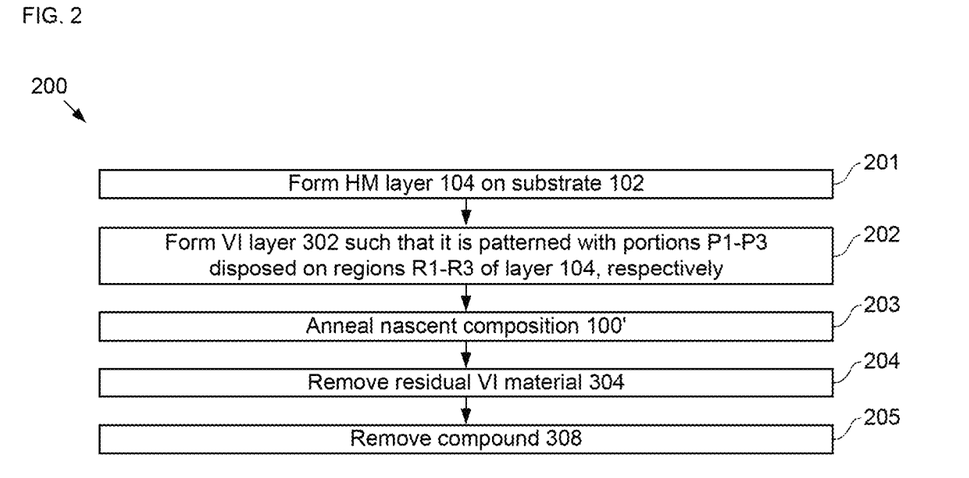
FIG. 2 depicts operations of a method suitable for forming a composition comprising a pattern of color-center regions in accordance with the present disclosure.

FIG. 2 depicts operations of a method suitable for forming a composition comprising a pattern of color-center regions in accordance with the present disclosure.

FIGS. 3A-E depict schematic drawings of composition 100 at different stages of its formation in accordance with the illustrative embodiment.

Method 200 is described herein with continuing reference to FIG. 1, as well as reference to FIGS. 3A-E. Method 200 begins with operation 201, where HM layer 104 is formed on substrate 102.

In the depicted example, substrate 102 is a conventional handle wafer comprising 1b diamond; however, substrate 102 can be any substrate and/or comprise any material suitable for supporting HM layer 104.

HM layer 104 is a layer of suitable host material 106 that is doped with impurity 108. In the depicted example, HM layer 104 is a layer of diamond doped with nitrogen that is overgrown on substrate 102 with suitable thickness, t1, using plasma-enhanced chemical vapor deposition (PECVD) with a nitrogen atmosphere. It should be noted, however, that HM layer 104 can be formed using any suitable process (e.g., spin coating, atomic-layer epitaxy, molecular beam epitaxy, vapor-phase epitaxy, sputtering, evaporation, wafer bonding, etc.) without departing from the scope of the present disclosure.

It should be further noted that, while the depicted example includes a layer of host material disposed on a handle substrate, in some embodiments, substrate 102 comprises host material 106 and formation of a host-material layer is not required.

Still further, in some embodiments, HM layer 104 includes a plurality of nanoparticles disposed on substrate 102, where each nanoparticle comprises the host material and impurity.

Figure 3A:
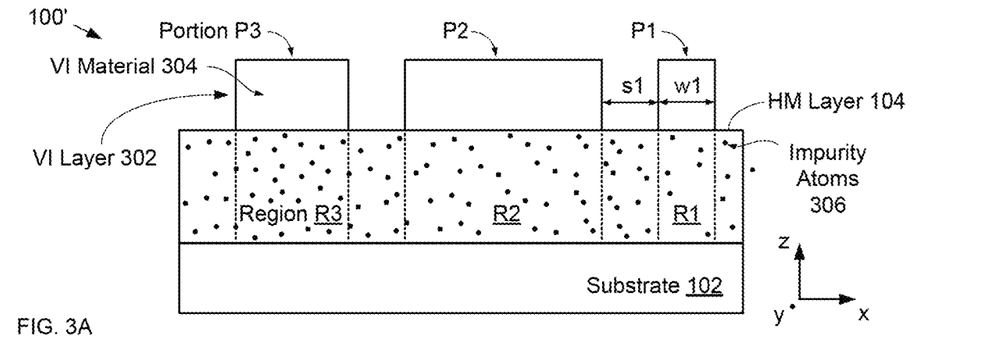
FIGS. 3A-E depict schematic drawings of composition 100 at different stages of its formation in accordance with the illustrative embodiment.

At operation 202, patterned vacancy-inducing (VI) layer 302 is formed on HM layer 104 in conventional fashion. VI layer 302 is formed such that it includes a pattern of portions of VI material 304 disposed on select regions of HM layer 104. In the depicted example, VI layer 302 is a suitably thick layer of aluminum that includes portions P1 through P3, which are disposed on regions R1 through R3 of HM layer 104, respectively.

In accordance with the present disclosure, suitable candidates for host material 302 and VI material 304 are characterized by an ability to collectively form a compound when heated to an appropriate temperature. Such an ability is typically indicated by a thermodynamic driving force evinced by a negative difference in the Gibbs energy of formation of the materials.

As will be apparent to one skilled in the art after reading this Specification, the materials used in composition 100 are merely exemplary and that myriad alternative materials and material combinations can be used for any or all of host material 106, impurity 108, and VI material 304 without departing from the scope of the present disclosure.

For example: materials suitable for use as host material 106 include, without limitation, diamond, silicon carbide, graphite, graphene, a metal oxide, a transition-metal dichalcogenide, and the like; materials suitable for use in impurity 108 include, without limitation, nitrogen, silicon, germanium, lead, oxygen, and the like; and materials suitable for use as VI material 304 include, without limitation, titanium, tantalum, and tungsten, among others.

In the depicted example, VI layer 302 is formed via a conventional lift-off process, which begins with the formation of a photoresist layer on the top surface of HM layer 104. The photoresist mask is then patterned using high-resolution lithography to selectively expose the top surface in regions R1 through R3 and a blanket coating of aluminum is deposited over the photoresist mask. As a result, aluminum deposits directly on and is in contact with the exposed top surface of HM layer 104 only in regions R1 through R3, while depositing on top of photoresist everywhere else. The photoresist is then removed along with all aluminum that is disposed on it. This results in a patterned VI layer 302 that contains only portions P1 through P3, which are disposed on and in direct contact with regions R1 through R3, respectively.

In some embodiments, VI layer 302 is formed via a different additive process, such as direct patterning through a shadow mask, and the like.

In some embodiments, VI layer 302 is formed via a conventional subtractive process, such as by depositing a layer of VI material 304 over the entire top surface of HM layer 104 and subsequently patterning the layer of VI material via lithography and etching to remove all VI material 304 except that residing on regions R1 through R3.

The use of high-resolution lithography to pattern VI layer 302 enables it to include features and/or spaces having lateral dimensions on the nanometer scale. In the depicted example, the width, w1, of portion P1 is less than one micron, while the spacing, s1, between portions P1 and P2 is also less than one micron. In fact, the minimum lateral dimensions of features and spacings in VI layer 302 is limited by only the limitations of available lithographic techniques. As a result, in some embodiments, at least one of w1 and s1 can be as small as only a few nanometers using currently available lithographic systems. It should be noted, however, that although the use of high-resolution lithography is often preferred, any suitable patterning technology can be used to pattern VI layer 302 without departing from the scope of the present disclosure.

FIG. 3A depicts a schematic drawing of a sectional view of nascent composition 100' after formation of patterned VI layer 302.

At operation 203, nascent composition 100' is annealed in an inert atmosphere (e.g., argon, etc.) at temperature T1 for a time sufficient to enable host material 106 and VI material 304 to form compound 308.

Temperature T1 is a temperature at which host material 106 and VI material 304 can form a compound. For host material of diamond and VI material of aluminum, temperature T1 is typically within the range of approximately 600° C. to approximately 900° C. with an anneal time within the range of approximately 2 hours to approximately 72 hours. As will be apparent to one skilled in the art, however, the value of temperature T1 and the duration of the anneal will depend upon the specific host material and VI material used. Furthermore, the duration of the anneal required to form compound 308 is normally further dependent upon the value of temperature T1.

Figure 3B:
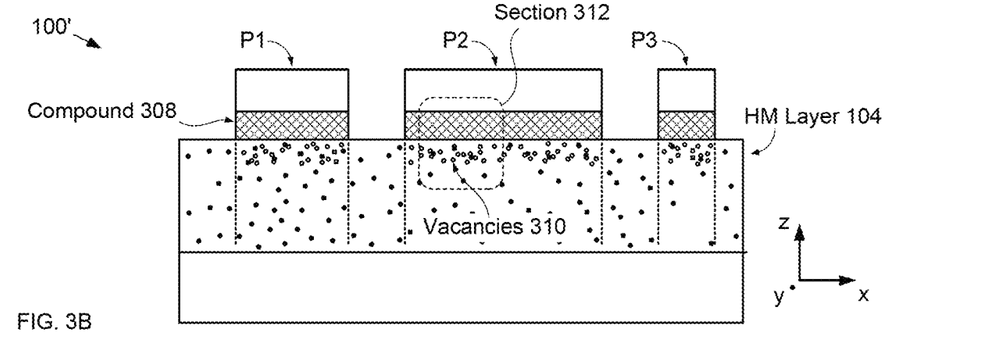

During operation 203, the thermodynamic driving force associated with the formation of compound 308 draws carbon atoms 314 from regions R1 through R3 of HM layer 104 into portions P1 through P3, respectively, thereby creating lattice vacancies 310 in these regions.

FIG. 3B depicts a schematic drawing of a sectional view of nascent composition 100' after creation of vacancies 310 in regions R1 through R3.

Figure 3C:
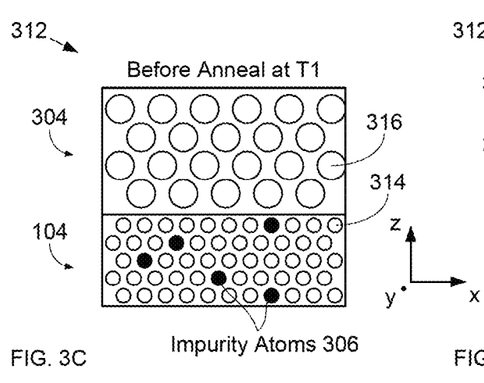
Figure 3D:
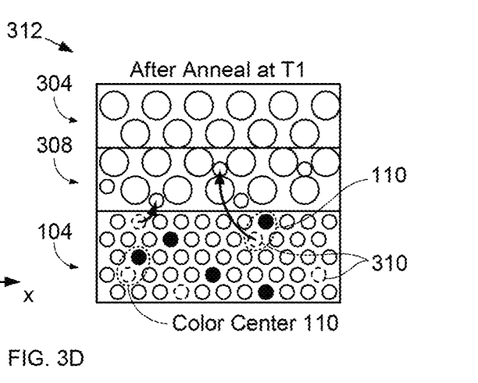

FIGS. 3C-D depict schematic drawings of an enlarged view of section 312, shown in FIG. 3B, before and after annealing, respectively. Section 312 encompasses some of region R2 and portion P2.

As indicated in FIG. 3C, prior to annealing, HM layer 104 includes a combination of atoms 314 and impurity atoms 306, while VI layer 302 includes only atoms 316. In the depicted example, atoms 314 and 316 are carbon and aluminum atoms, respectively, and impurity atoms 306 are nitrogen atoms.

After annealing, as indicated in FIG. 3D, as some of the carbon atoms 314 diffuse into VI material 304 and react with aluminum atoms 316 to form compound 308, which in the depicted example, is aluminum carbide.

One skilled in the art will recognize that the form of compound 308 is dependent upon the choice of materials for host material 106 and VI material 304 and, therefore, myriad compounds are within the scope of the present disclosure. For example, depending upon the choices of host material 106 and VI material 304, compound 308 can be formed as a carbide, a nitride, an oxide, a silicide, or any of a wide range of other compounds.

As further indicated in FIG. 3D, the diffusion of the carbon atoms into the VI layer from regions R1 through R3 leaves behind a number of lattice vacancies 310, at least some of which interact with impurity atoms 306 to form color centers 110.

Figure 3E:
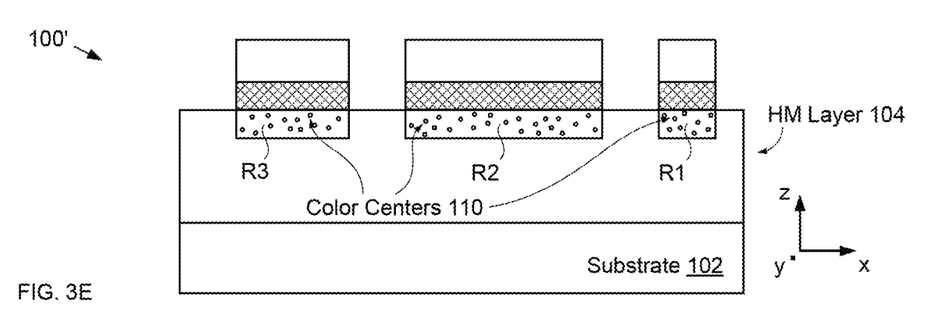

FIG. 3E depicts a schematic drawing of a sectional view of nascent composition 100' after the formation of color centers 110 in each of regions R1 through R3. For clarity, vacancies 310 and impurity atoms 306 are not shown in FIG. 3E.

At operation 204, residual VI material 304 is removed from nascent substrate 100' using a suitable removal process. For example, for VI material comprising aluminum, the residual material can be removed by soaking the nascent composition in a bath containing a 25% hydrofluoric acid (HF) solution.

At operation 205, fabrication of composition 100 is completed by the removal of compound 308 using a suitable removal process. For example, a compound comprising aluminum carbide (and any graphite formed during the annealing procedure) can be removed by immersion of the nascent composition in a boiling solution containing equal parts of nitric acid (HNO3), sulfuric acid (H2SO4), and perchloric acid (HClO4).

Once the regions of residual VI material 304 and compound 308 are removed, color-center-containing regions CC1 through CC3 are complete and their surfaces are optically accessible using conventional techniques.

Figure 4:
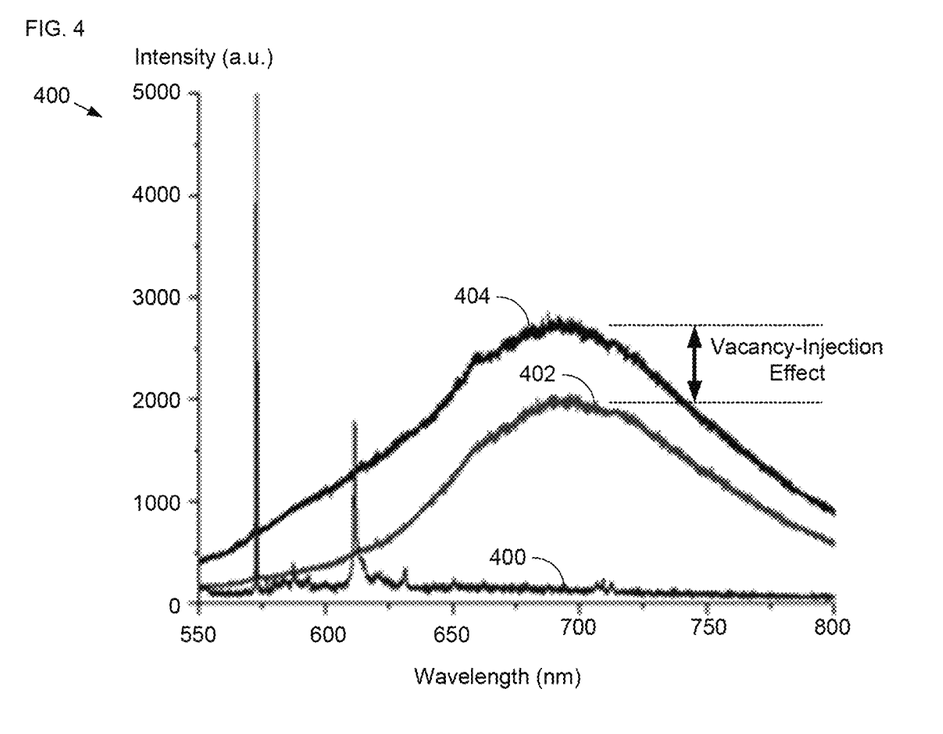
FIG. 4 depicts a plot showing the effectiveness of the formation of color centers in accordance with the present disclosure.

FIG. 4 depicts a plot showing the effectiveness of the formation of color centers in accordance with the present disclosure. Plot 400 includes measured photoluminescence spectra for a host material layer in its original state before formation of color centers, an untreated region of the host layer after formation of color centers, and a treated region of the host material layer after formation of color centers.

Trace 402 shows the photoluminescence of HM layer 104 before operations 202 through 205 (i.e., in its as-deposited state).

Trace 404 shows the photoluminescence of an untreated region of HM layer 104 (i.e., at a point outside of regions R1, R2, and R3) after formation of color centers 110.

Trace 406 shows the photoluminescence of a color-center containing region (i.e., one of color-center-containing regions CC1, CC2, and CC3) after formation of color centers 110.

As clearly shown in plot 400, a significant increase in photoluminescence is realized simply by subjecting composition 100 to a high-temperature anneal. However, as also seen from the plot, the photoluminescence of a treated region of the host material layer is markedly higher than that of an untreated region (denoted as the vacancy-injection effect).

It should be noted that the diffusivity of vacancies in regions R1 through R3 during annealing is estimated at approximately $2.2 \times 10^{-18}$ cm$^2$/s at a temperature, T1, of 600° C. It is an aspect of the teachings herein that these short diffusion distances can be exploited to afford embodiments in accordance with the present disclosure several significant advantages over color-center-containing compositions of the prior art.

First, because the color-center-containing regions are defined by the pattern of VI layer 302, which can be patterned using high-resolution patterning techniques (e.g., stepper photolithography, x-ray lithography, nano-imprint lithography, etc.), VI layer 302 can be defined with nanometer-scale lateral dimensions.

Second, the extremely short diffusion distances for carbon atoms and vacancies in diamond limits the creation of lattice vacancies to a very short distance beyond the edges of regions R1 through R3. The fidelity between the pattern of the resultant color-center-containing regions and the pattern of VI layer 302, therefore, is very high. As a result, the teachings of the present disclosure enable formation of a highly spatially controlled pattern of color-center-containing regions that also can have nanometer-scale lateral dimensions.

Third, the short diffusion distance for carbon atoms and vacancies in diamond substantially limits the depths at which vacancies will be formed within HM layer 104, thereby enabling color-center-containing regions having a high-density of near-surface color centers. In the depicted example, the thickness, t1, of HM layer 104 is substantially equal to the maximum depth at which vacancies 310 are formed; however, in some embodiments, this maximum depth can be much shallower.

Figure 5:
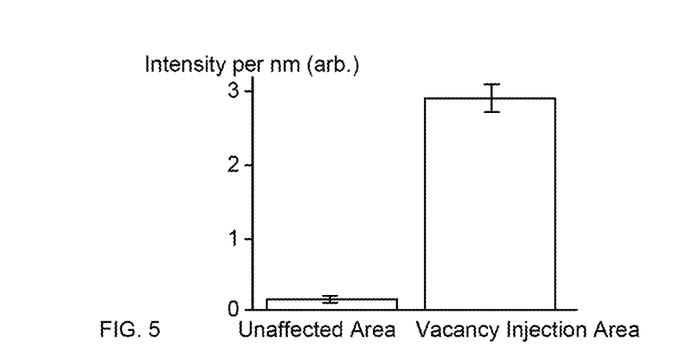
FIG. 5 depicts a histogram showing the vacancy-injection effect taking into in consideration the shallowness of the segment of regions R1, R2, and R3 in which vacancies are realized.

FIG. 5 depicts a histogram showing the vacancy-injection effect taking into in consideration the shallowness of the segment of regions R1, R2, and R3 in which vacancies are realized. As seen in plot 500, the vacancy injection intensity in treated regions is significantly higher than untreated regions. In fact, for an estimated diffusion depth of approximately 10 nm), the increase in vacancy injection intensity is estimated to be approximately 1800%.

Figure 6A:
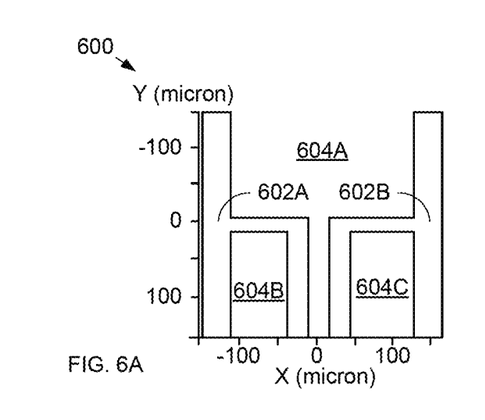
FIGS. 6A-B depict a schematic drawing of a patterned region of color-center-containing regions and a spatial plot of emission intensity for the patterned region, respectively.
Figure 6B:
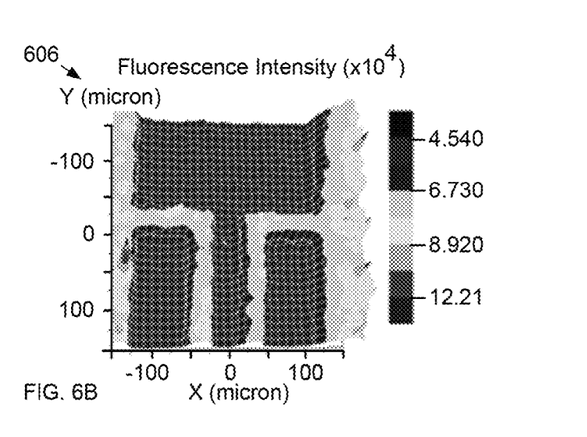

FIGS. 6A-B depict a schematic drawing of a patterned region of color-center-containing regions and a spatial plot of emission intensity for the patterned region, respectively. Pattern 600 includes regions 602A and 602B and regions 604A-C.

Regions 602A and 602B are regions of HM layer 104 that have been annealed while in contact with vacancy-inducing layer 302, as discussed above.

Regions 604A-C are regions of HM layer 104 that were not in contact with vacancy-inducing layer 302 during the anneal.

Plot 606 shows the patterned emission from pattern 600. It is clear from plot 606 that treated regions 602A and 602B provide significantly greater color-center intensity than untreated regions 604A-C.

Figure 7A:
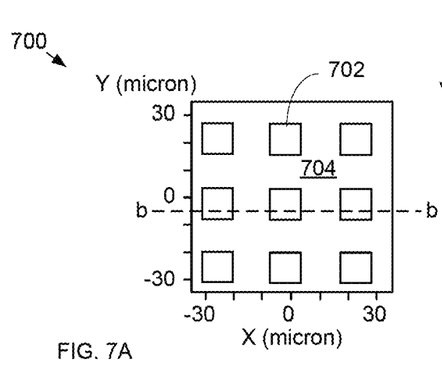
FIG. 7A depicts a schematic drawing of another pattern of color-center-containing regions in accordance with the present disclosure.

FIG. 7A depicts a schematic drawing of another pattern of color-center-containing regions in accordance with the present disclosure. Pattern 700 includes a 3×3 array of regions 702.

Each of regions 702 is a 10-micron by 10-micron region of a 200 nm-thick nitrogen-doped diamond layer disposed on a conventional diamond handle substrate. Regions 702 are treated to form nitrogen-vacancy (NV) color centers via a method analogous to method 200 described above. Each region 702 is surrounded by a field of untreated material.

Figure 7B:
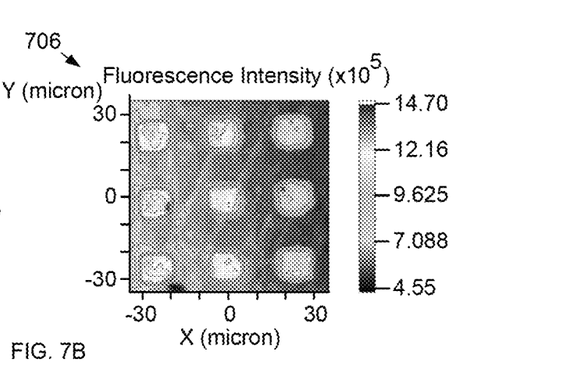
FIG. 7B depicts a spatial plot of emission intensity for the patterned region of FIG. 7A.

FIG. 7B depicts a spatial plot of emission intensity for pattern 700. Plot 706 maps the fluorescence of regions 702 based on sideband emission from 640-670 nm.

Figure 7C:
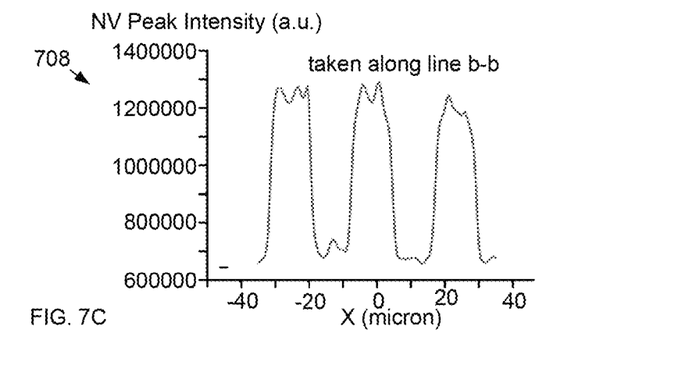
FIG. 7C depicts a line scan of fluorescence taken along line b-b, as depicted in FIG. 7A.

FIG. 7C depicts a line scan of fluorescence taken along line b-b, as depicted in FIG. 7A. Scan 708 shows the fluorescence of three regions 702 after removal of the background baseline.

While the illustrative embodiment comprises host material of diamond and vacancy-inducing material of aluminum, it will be clear to one skilled in the art, after reading this Specification, that the diffusion distances of vacancies and atoms of other suitable materials are likely on the same scale as those provided above. As a result, the advantages outlined above are also afforded embodiments comprising a different host material and/or a different vacancy-inducing material.

In some applications, even tighter control over vacancy generation is required due to vacancy extinguishment at surfaces. Some embodiments in accordance with the present disclosure, therefore, include a host-material layer comprising a monolayer of nanoparticles disposed on a substrate, where each nanoparticle comprises impurity-doped host material. This limits the formation of color centers to the body of the nanoparticles.

Figure 8:
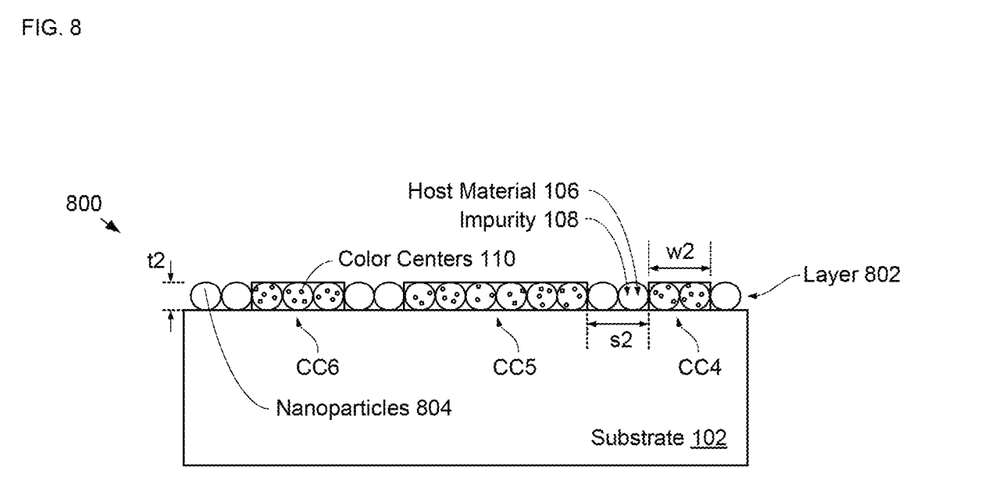
FIG. 8 depicts a sectional view of an alternative embodiment of a composition comprising a pattern of color-center regions suitable for use in a quantum-technology application in accordance with the present disclosure.

FIG. 8 depicts a sectional view of an alternative embodiment of a composition comprising a pattern of color-center regions suitable for use in a quantum-technology application in accordance with the present disclosure. Composition 800 includes substrate 802, HM layer 802, and color-center-containing regions CC3-CC6.

HM layer 802 is a monolayer of nanoparticles 804 disposed on the top surface of substrate 102. Each of nanoparticles includes host material 106 and impurity 108 and has a diameter of approximately 5 nm. As a result, the thickness, t2, of HM layer 802 is approximately 5 nm.

HM layer 802 is formed on substrate 802 in conventional fashion, such as via a Langmuir-Blodgett deposition process. In some embodiments, nanoparticles 804 are disposed on substrate 102 using a different method, such as chemical-vapor deposition, deposition from a solution in which the nanoparticles are suspended, and the like. In some embodiments, the nanoparticles do not form a monolayer.

After its formation, color-containing regions CC3-CC6 are defined in HM layer 802 by forming color centers 110 in nanoparticles 804 via a method in accordance with the present disclosure, such as method 200 described above.

Since the host material layer is only 5-nm thick, the vertical positions of the color centers in composition 800 are all held within this thickness range.

Although the diameter of nanoparticles is approximately 5 nm, it will be clear to one skilled in the art, after reading this Specification, how to make and use alternative embodiments in which nanoparticles 804 have a different diameter. Furthermore, it will be apparent, after reading this Specification, that the control over the depth of the color centers is proportional to the diameter of the nanoparticles included in HM layer 802.

It should be noted that, in some embodiments, the carbide formed in HM layer 802 acts as a diffusion barrier that mitigates vacancy extinguishment.

In some embodiments, after color centers 110 are formed in nanoparticles 804, the nanoparticles are stripped from substrate 102, collected, and sorted for later use.

It is to be understood that the disclosure teaches just some examples of the illustrative embodiment and that many variations of the invention can easily be devised by those skilled in the art after reading this disclosure and that the scope of the present invention is to be determined by the following claims.

What is claimed is:

1. A method for forming color centers (110) in a body (102), the method including:
    providing the body such that it includes a first region (R1) that comprises a first material (106) and a first impurity (108);
    forming a first layer (302) having a first portion (P1) disposed on and in contact with the first region, wherein the first layer comprises a second material (304), and wherein the first and second materials collectively form a first compound (308) at a first temperature (T1); and
    heating the first layer and the body to the first temperature, wherein heating the first layer and the body to the first temperature causes:
    (1) diffusion of a first plurality of atoms (314) of the first material from the first region into the first portion to create a first plurality of vacancies (310) in the first region; and
    (2) interaction of the first plurality of vacancies and atoms (306) of the first impurity to thereby form a first plurality of color centers (110) in the first region.

2. The method of claim 1 further including removing the first layer and the first compound.

3. The method of claim 1 the first compound comprises a carbide.

4. The method of claim 1 wherein the first material is selected from the group consisting of diamond, silicon carbide, graphite, graphene, metal oxides, and transition-metal dichalcogenides (TMD).

5. The method of claim 1 wherein the second material is selected from the group consisting of aluminum, titanium, tantalum, and tungsten.

6. The method of claim 1 wherein the first impurity is selected from the group consisting of nitrogen, silicon, germanium, lead, and oxygen.

7. The method of claim 1 wherein the first material comprises diamond and the second material comprises aluminum.

8. The method of claim 7 wherein the first impurity comprises nitrogen.

9. The method of claim 1 wherein the body comprises at least one nanoparticle.

10. The method of claim 1:
    wherein the body is provided such that it further includes a second region (R2) that comprises the first material and the first impurity;
    wherein the first layer is formed such that it has a second portion (P2) disposed on and in contact with the second region; and
    wherein heating the first layer and the body to the first temperature further enables:
    (3) diffusion of a second plurality of atoms of the first material from the second region into the second portion to create a second plurality of vacancies in the second region; and
    (4) interaction of the second plurality of vacancies and atoms of the first impurity to form a second plurality of color centers in the second region.

11. The method of claim 10 wherein the first layer is formed such that it has a feature that is less than or equal to one micron, and wherein the feature is selected from the group consisting of (1) a separation (s1) between the first portion and second portion and (2) a lateral dimension (w1) of at least one of the first portion and the second portion.

12. A method for forming color centers (110) in a body (102), the method including:
    providing the body such that it includes a first region (R1) that comprises diamond and nitrogen;
    forming a first layer (302) having a first portion (P1) disposed on and in contact with the first region, wherein the first layer comprises aluminum; and
    heating the first layer and the body to a first temperature (T1), wherein heating the first layer and the body to the first temperature enables:
    (1) formation of a carbide (308) on the first region;
    (2) diffusion of a first plurality of carbon atoms (314) from the first region into the first portion to create a plurality of vacancies (310) in the first region; and
    (3) interaction of the plurality of vacancies and nitrogen atoms (306) in the first region to form a first plurality of nitrogen-vacancy (NV) color centers (110) in the first region.

13. The method of claim 12 wherein the body comprises at least one nanoparticle (704).

14. The method of claim 12 further including removing the first layer and the carbide.

15. The method of claim 12:
    wherein the body is provided such that it further includes a second region (R2) that comprises diamond and nitrogen;
    wherein the first layer is formed such that it has a second portion (P2) disposed on and in contact with the second region; and
    wherein heating the first layer and the body further enables:
    (3) formation of a carbide on the second region;
    (4) diffusion of a second plurality of carbon atoms from the second region into the second portion to create a second plurality of vacancies in the second region; and
    (4) interaction of the second plurality of vacancies and nitrogen atoms to form a second plurality of NV color centers in the second region.

* * * * *